(12) United States Patent
Yu et al.

(10) Patent No.: US 7,537,883 B2
(45) Date of Patent: May 26, 2009

(54) METHOD OF MANUFACTURING NANO SIZE-GAP ELECTRODE DEVICE

(75) Inventors: Han Young Yu, Daejeon (KR); In Bok Baek, Cheongju-si (KR); Chang Geun Ahn, Daejeon (KR); Ki Ju Im, Daejeon (KR); Jong Heon Yang, Daejeon (KR); Ung Hwan Pi, Daejeon (KR); Min Ki Ryu, Seoul (KR); Chan Woo Park, Daejeon (KR); Sung Yool Choi, Daejeon (KR); Seong Jae Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 450 days.

(21) Appl. No.: 11/447,820

(22) Filed: Jun. 6, 2006

(65) Prior Publication Data

US 2007/0072336 A1    Mar. 29, 2007

(30) Foreign Application Priority Data

Sep. 29, 2005    (KR) .................... 10-2005-0091288

(51) Int. Cl.
*G03F 7/00* (2006.01)
*H01L 51/40* (2006.01)
*C25D 5/18* (2006.01)

(52) U.S. Cl. .................... 430/313; 430/311; 430/314; 430/317; 430/319

(58) Field of Classification Search ................ 430/319, 430/311, 313, 314, 317
See application file for complete search history.

(56) References Cited

U.S. PATENT DOCUMENTS

| 5,751,156 | A | 5/1998 | Muller et al. |
| 6,447,663 | B1 | 9/2002 | Lee et al. |
| 7,385,295 | B2* | 6/2008 | Son et al. ..................... 257/776 |
| 2002/0018964 | A1* | 2/2002 | Jerominek ................... 430/313 |
| 2002/0168810 | A1 | 11/2002 | Jackson |

OTHER PUBLICATIONS

'Fabrication of nanocontacts for molecular devices using nanoimprint lithography' Austin et al., J. Vac. Sci. Technol. B 20(2), Mar./Apr. 2002, 2002 American Vacuum Society, pp. 665-667.
'Conductance of a Molecular Junction' Reed et al., Science, vol. 278, Oct. 1997, pp. 252-254.
'Controlled fabrication of metallic electrodes with atomic separation' Morpurgo et al., Applied Physics Letters, vol. 74, No. 14, Apr. 1999, pp. 2084-2086.
'Fabrication of metallic electrodes with nanometer separation by electromigration' Park et al., Applied Physics Letters, vol. 75, No. 2, Jul. 1999, pp. 301-303.
'Nanometer-spaced electrodes with calibrated separation' Applied Physics Letters, vol. 80, No. 2, Jan. 2002, pp. 321-323.

* cited by examiner

*Primary Examiner*—Mark F Huff
*Assistant Examiner*—Caleen O Sullivan
(74) *Attorney, Agent, or Firm*—Ladas & Parry LLP

(57) ABSTRACT

Provided is a method of manufacturing a nano size-gap electrode device. The method includes the steps of: disposing a floated nano structure on a semiconductor layer; forming a mask layer having at least one opening pattern to intersect the nano structure; and depositing a metal on the semiconductor layer exposed through the opening pattern to form an electrode, such that a nano size-gap is provided under the nano structure by the nano structure.

11 Claims, 6 Drawing Sheets

METHOD OF MANUFACTURING NANO SIZE-GAP ELECTRODE DEVICE

CROSS-REFERENCE TO RELATED APPLICATION

This application claims priority to and the benefit of Korean Patent Application No. 2005-91288, filed Sep. 29, 2005, the disclosure of which is incorporated herein by reference in its entirety.

BACKGROUND

1. Field of the Invention

The present invention relates to a nano size-gap electrode device in which two electrodes adjoin each other with a nano size-gap having a width less than several nanometers (nm) interposed there between, and more particularly, to a method of manufacturing a nano size-gap electrode device, in which a nano size-gap may be easily controlled in position and distance and a plurality of nano size-gaps with a repeated structure may be concurrently formed.

2. Discussion of Related Art

As information telecommunication technology continues to develop, an amount of transmittable information is increasing exponentially, and a degree of integration of a semiconductor device for processing the exponentially growing information is also increasing. In conventional art, the degree of integration of a semiconductor device increases in a top-down method in which size and line width are reduced by improving the resolution of a photolithography process, but it has become difficult to continue applying the top-down method due to process difficulty and cost increase. Accordingly, a nano molecular device for overcoming this limitation and enhancing cost efficiency has been developed, and in recent years, a molecular device manufactured by using a bottom-up method has been proposed.

Unlike a conventional semiconductor device based on silicon, the molecular device uses an electron transport phenomenon accomplished through molecules having a length less than several nanometers. The molecular device is rising as next generation technology since it can realize a highly integrated, high-speed circuit at low cost. The molecular device requires external electrodes connected to both ends in order to evaluate an electrical characteristic. For this, it is essential to realize an electrode device having at least a pair of electrodes which are spaced each other by a nano size-gap corresponding to a molecular length less than several nanometers.

A conventional nano size-gap electrode device is manufactured by using a method in which a specific part of a metal line already formed is cut by mechanical stress or electromigration, or a method in which a gap having a width of hundreds of nanometers is primarily formed by using an electron-beam lithography technique and then an electrode material is additionally deposited on surfaces of two electrodes interposing the gap using an electrochemical deposition method, to reduce the width of the gap. However, not only do these methods involve complex processes, but they do not enable precise control of the width and position of the gap, and they exhibit poor reproducibility and reliability. Further, they are unable to provide a plurality of nano size-gaps having the same structure, shape and width simultaneously, and therefore are not ideally suitable for the manufacture of a molecular electronic circuit.

SUMMARY OF THE INVENTION

The present invention is directed to a method of manufacturing a nano size-gap electrode device, wherein a nano size-gap between electrodes may be accurately controlled in width and position and plural pairs of electrodes of the nano size-gap electrode device may be concurrently formed.

One aspect of the present invention provides a method of manufacturing a nano size-gap electrode device, including the steps of: disposing a floated nano structure on a semiconductor layer; forming a mask layer having at least one opening pattern to intersect the nano structure; and forming electrodes by depositing a metal on the semiconductor layer exposed through the opening pattern such that a nano size-gap between electrodes is formed under the nano structure.

The step of disposition the nano structure may include the steps of: forming first and second semiconductor layers in a layered structure; patterning the second semiconductor layer to form the nano structure; and removing the first semiconductor layer under the nano structure by a predetermined thickness such that the nano structure is supported.

The nano structure may include a nano size-gap forming part with a wire pattern and supporting parts supporting both sides of the nano size-gap forming part.

The metal may be deposited at a predetermined tilt angle at both sides of the nano structure, and the width of the nano size-gap may be controlled by at least one of a width of the nano structure, a height of the nano structure, and a deposition angle of the metal.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION OF PREFERRED EMBODIMENTS

Hereinafter, an exemplary embodiment of the present invention will be described in detail. However, the present invention is not limited to the embodiments disclosed below, but may be implemented in various types. Therefore, the present embodiment is provided for complete disclosure of the present invention and to fully inform the scope of the present invention to those ordinarily skilled in the art.

FIGS. 1 to 7 are cross-sectional views illustrating a method of manufacturing a nano size-gap electrode device according to a first embodiment of the present invention.

Figure 1:
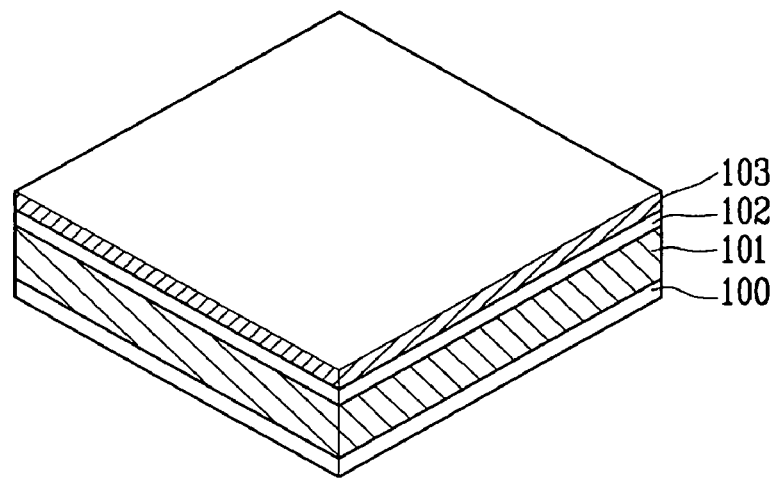
FIGS. 1 to 7 are cross-sectional views illustrating a method of manufacturing a nano size-gap electrode device according to a first embodiment of the present invention.

Referring to FIG. 1, a first semiconductor layer 101, a second semiconductor layer 102, and a photosensitive layer 103 are sequentially formed on a substrate 100 supporting the device. The substrate 100 may be formed of glass, oxide, polymer, silicon, compound semiconductor, metal, or a combination thereof. The first and second semiconductor layers 101 and 102 are formed of materials with different etching rates from each other, for example, materials with different crystal structures, or materials (compound) with different combinations. The material may include silicon (Si), poly silicon (Poly-Si), oxide, nitride, or so forth.

Figure 2:
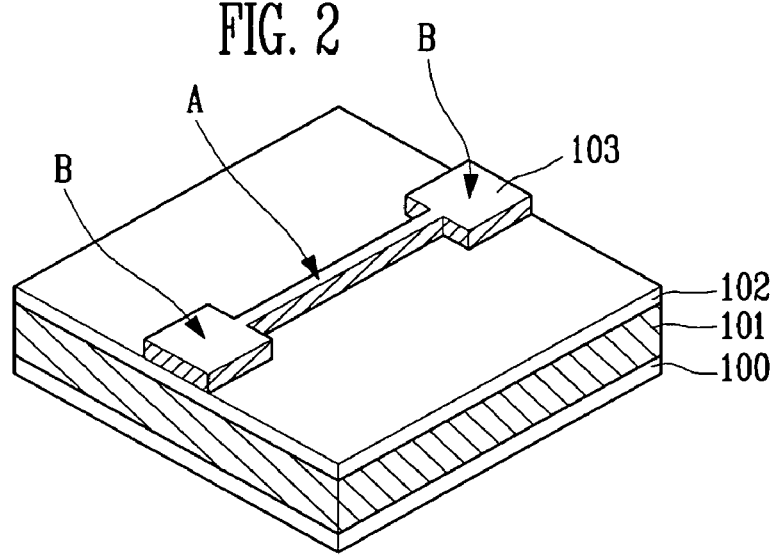

Referring to FIG. 2, the photosensitive layer 103 is patterned by predetermined photolithography and development processes to form a wire pattern (A) for forming a nano size-gap and support patterns (B) connected to both sides of the wire pattern (A). The support pattern (B) should have a larger area than that of the wire pattern (A).

Figure 3:
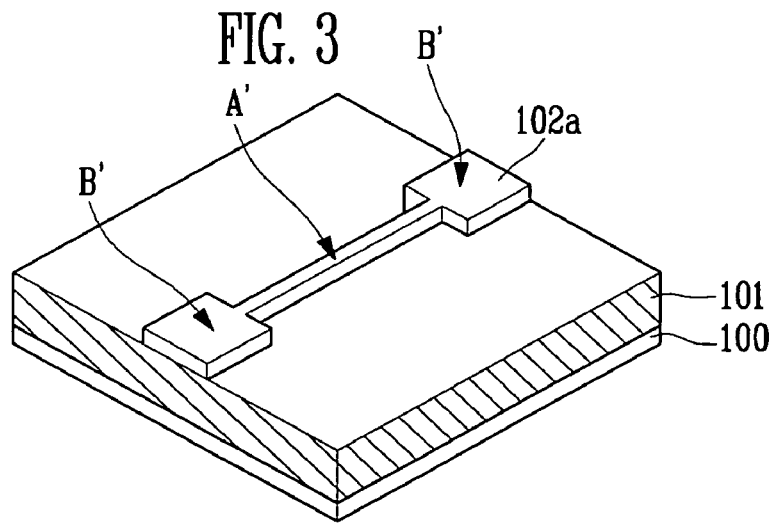

Referring to FIG. 3, an exposed portion of the second semiconductor layer 102 is etched by an etching process using the patterned photosensitive layer 103 as a mask to form a nano structure 102a and then the photosensitive layer 103 is removed. The nano structure 102a has the same shape as the patterned photosensitive layer 103. In other words, the nano structure 102a includes a nano size-gap forming part (A') of a wire type formed by the wire pattern (A), and supporting parts (B') formed by the support patterns (B) and connected to both sides of the nano size-gap forming part (A'). In order to accurately control the width of the nano size-gap, the nano structure 102a is preferably etched in a vertical shape at a sidewall.

The width (w) of the nano size-gap forming part (A') may be controlled to have a size of micrometer or less depending on the resolution of photo equipment. In general photo equipment, the nano size-gap forming part (A') may be controlled to have a width of 70 nm to 80 nm or less, and in electron-beam equipment, the nano size-gap forming part (A') may be controlled to have a width of 50 nm or less.

Figure 4:
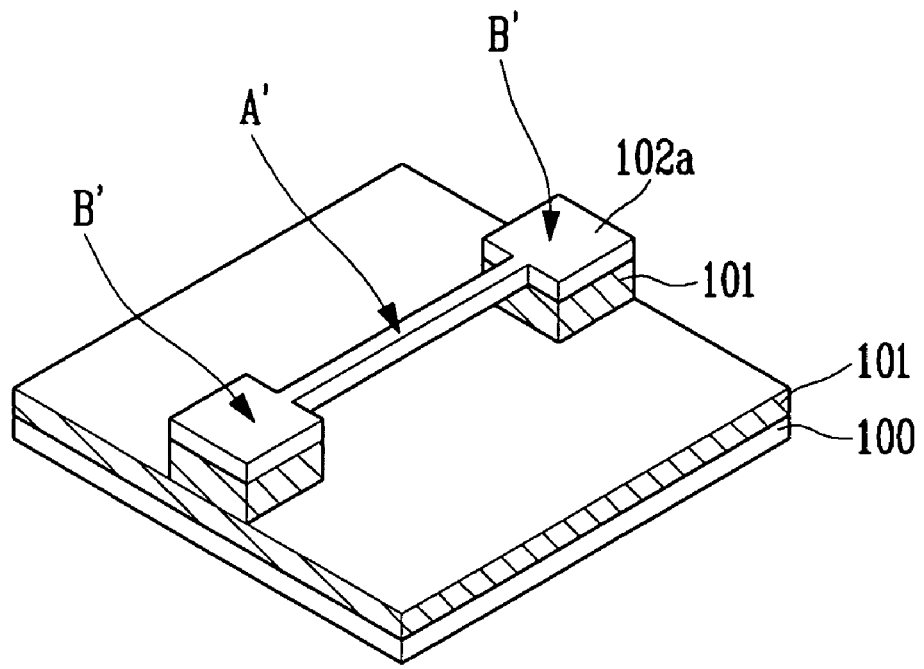

Referring to FIG. 4, an exposed portion of the first semiconductor layer 101 is etched by an etching process using the nano structure 102a as a mask by a predetermined thickness. When wet etching is used, the first semiconductor layer 101 under the nano size-gap forming part (A') is completely removed by isotropic etching, whereas, the first semiconductor layer 101 under the supporting parts (B') is only partially removed. Accordingly, the nano size-gap forming part (A') of the nano structure 102a is floated in the air supported by the supporting parts (B').

Figure 5:
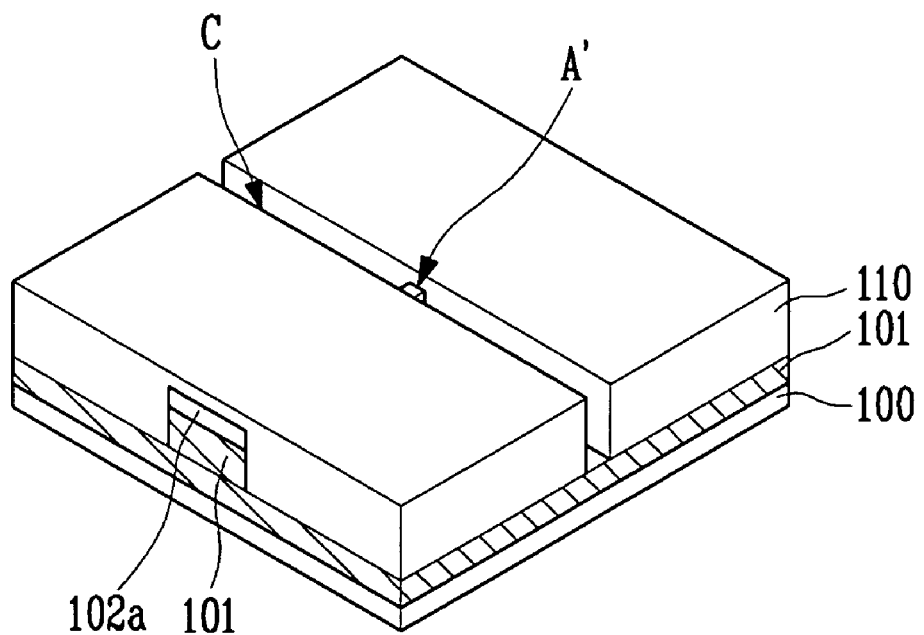

Referring to FIG. 5, a mask layer 110 is formed on the entire surface including the nano structure 102a to have an opening pattern (C) crossing the nano size-gap forming part (A') of the nano structure 102a. The mask layer 110 may employ a photosensitive material, for example, and after the photosensitive layer is formed on the entire surface, the photosensitive layer may be patterned to form the opening pattern (C) through photolithography and development processes using a predetermined mask. The opening pattern (C) may be formed according to the shape of an electrode to be used as a source and a drain, for example, in a stripe shape.

Figure 6:
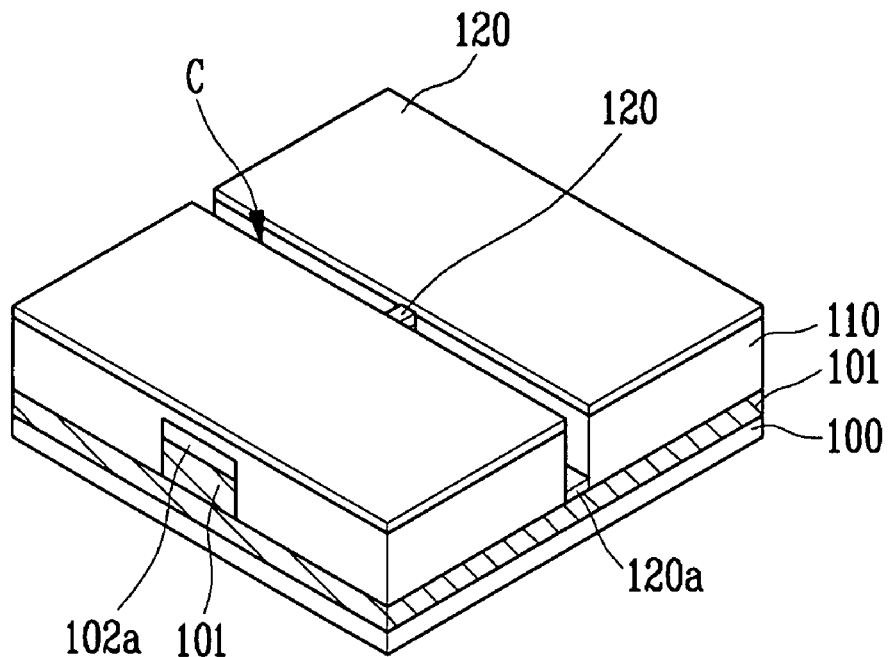
Figure 8:
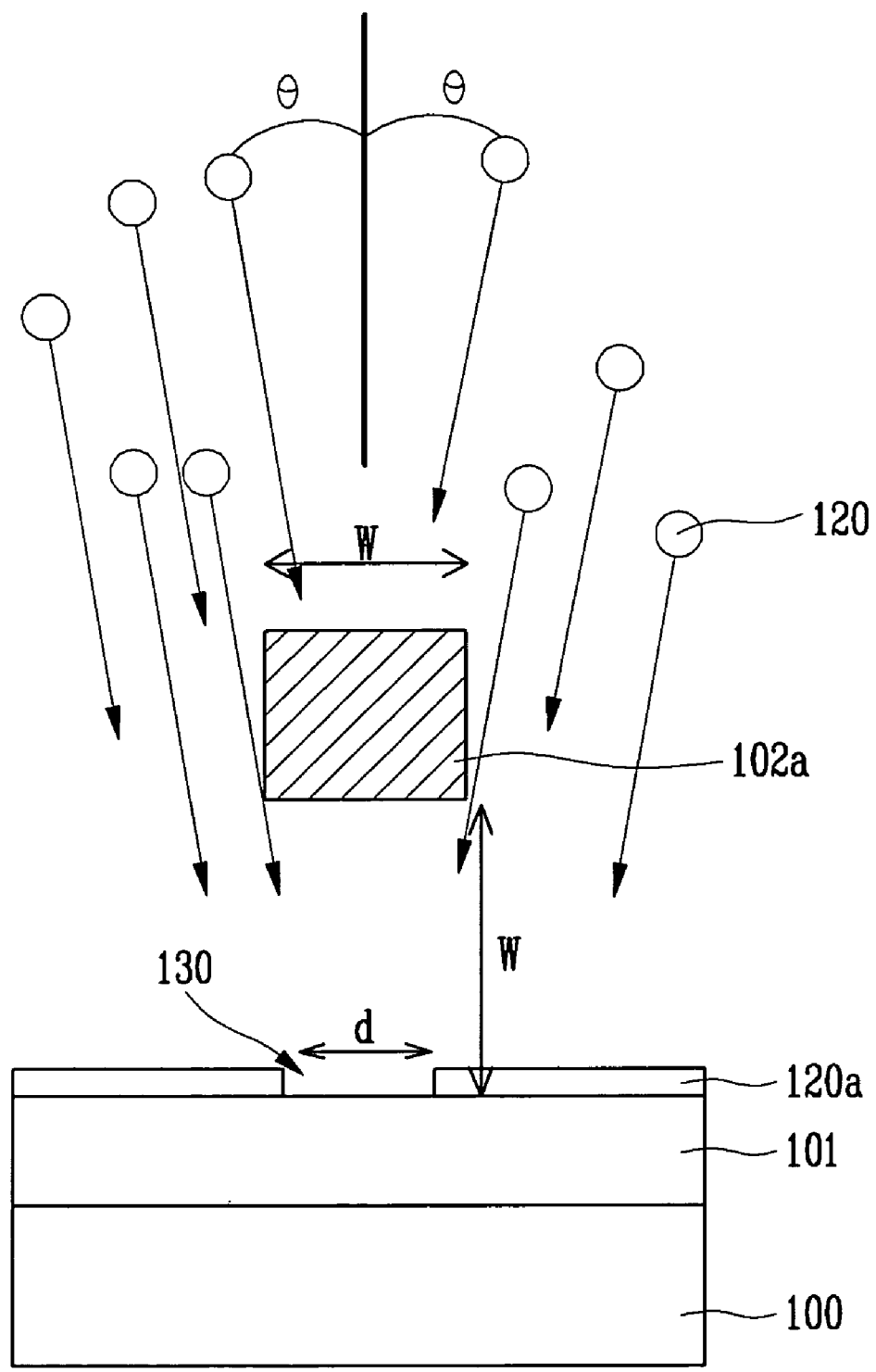
FIG. 8 illustrates an example of a metal deposition process of FIG. 6.

Referring to FIGS. 6 and 8, when a metal 120, such as gold, silver, copper, and aluminum, is deposited on the entire surface, the metal 120 is deposited on the first semiconductor layer 101 exposed through the opening pattern (C), thereby forming an electrode 120a having the shape of the opening pattern (C). In case a deposition angle of the metal 120 is controlled to a predetermined angle (θ) as in FIG. 8, the metal 120 is not deposited under the nano size-gap forming part (A') of the nano structure 102a. Therefore, the width (d) of the nano size-gap 130 may be provided to be smaller than that of the nano size-gap forming part (A'). The electrodes 120a are formed at both sides of the nano size-gap 130. For example, the metal 120 is deposited at a predetermined tilt angle (θ) at both sides of the nano structure 102a, by using a tilt deposition method.

Figure 7:
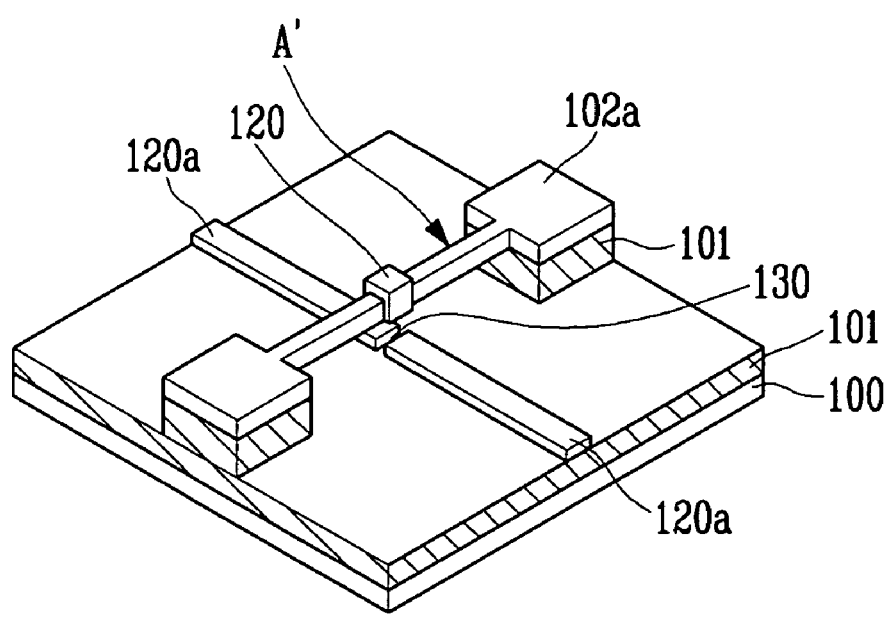

Referring to FIG. 7, the metal 120 and the mask layer 110 are sequentially removed.

In the present invention, the width and position of the nano size-gap 130 may be easily controlled depending on a height (h) of the nano structure 102a—a height (h) ranged from the first semiconductor layer 101 to the nano structure 102a, the width (w) of the nano structure 102a, and the deposition angle (θ) of the metal 120. As an experimental result, when the height (h) and the width (w) are controlled to about 100 nm, the nano size-gap 130 may be formed to have a width (d) of 5 nm or less.

After that, the nano structure 102a and the metal 120 deposited on the nano structure 102a may be removed, or the metal 120 deposited on the nano structure 102a may be used as a back gate.

In the first embodiment of the present invention, the method of manufacturing a nano size-gap electrode device having a pairs of electrodes are described, but in the second embodiment of the present invention, a nano size-gap electrode device having plural pairs of electrodes in the form of an array may be manufactured.

Figure 9:
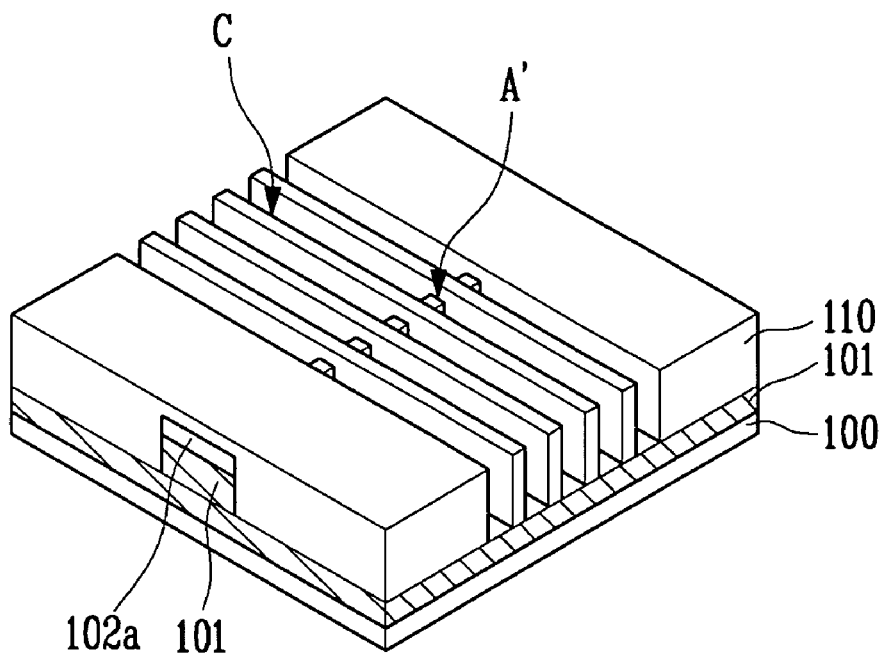
FIGS. 9 and 10 are cross-sectional views illustrating a method of manufacturing a nano size-gap electrode device according to a second embodiment of the present invention.

Referring to FIG. 9, after the processes of FIGS. 1 to 4 are performed, a mask layer 110 having, for example, a stripe typed array in which a plurality of opening patterns (C) are formed at a predetermined interval to across a nano size-gap forming part (A') of a nano structure 102a is formed on the resultant structure including the nano structure 102a. The mask layer 110 may be formed by the same method as that of FIG. 5D.

Figure 10:
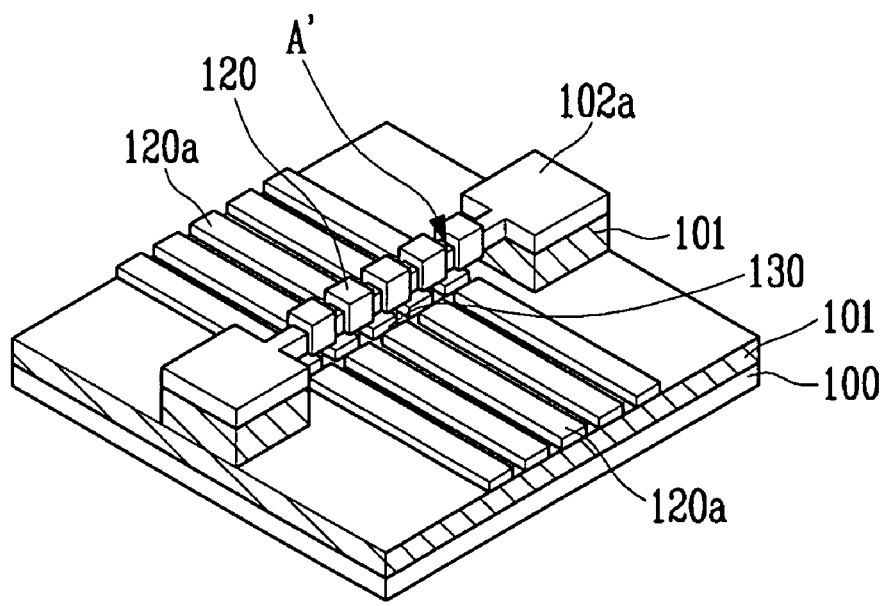

Referring to FIG. 10, when a metal 120, such as gold, silver, copper, and aluminum, is deposited on the resultant structure, the metal 120 is deposited on the first semiconductor layer 101 exposed through the opening pattern (C), thereby forming a plurality of electrodes 120a having the shape of the opening pattern (C). After that, the metal 120 and the mask layer 110 are removed.

In case a deposition angle of the metal 120 is controlled to a predetermined angle (θ) as in FIG. 8, the metal 120 is not deposited under the nano size-gap forming part (A') of the nano structure 102a. Therefore, the width of the nano size-gap 130 may be formed to be smaller than that of the nano size-gap forming part (A'). The electrodes 120a are formed at both sides of the nano size-gap 130.

Figure 11:
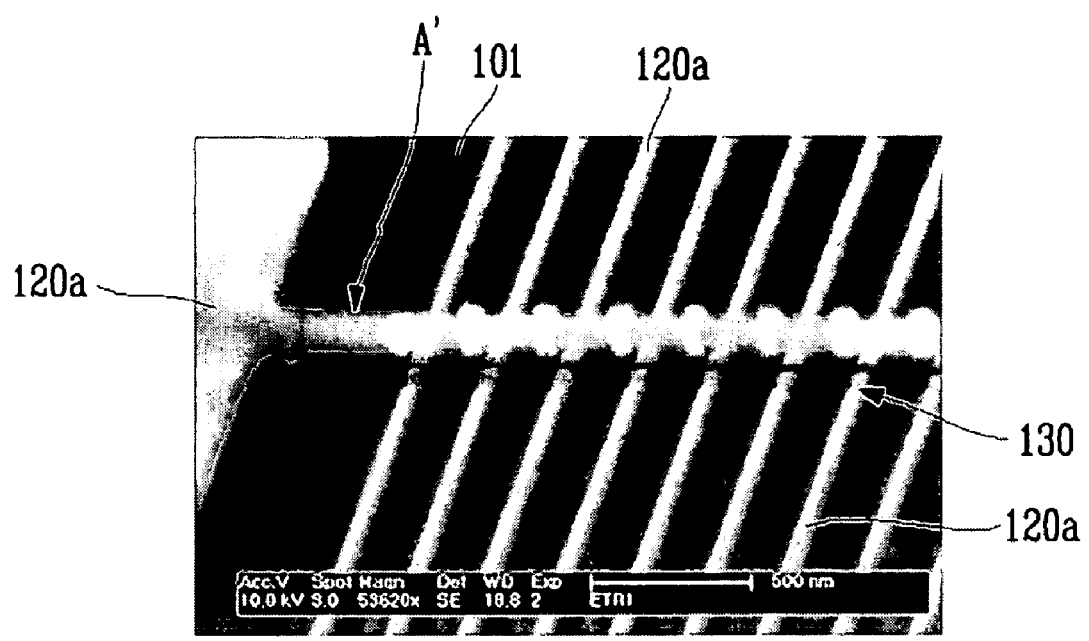
FIG. 11 is a scanning electron microscope (SEM) image of a nano size-gap electrode device manufactured according to the present invention.

FIG. 11 is a scanning electron microscope (SEM) image of a nano size-gap electrode device manufactured according to the present invention, and illustrates a nano size-gap electrode device having plural pair of electrodes in the form of an array manufactured according to the second embodiment of the present invention.

The inventive nano size-gap electrode device is applicable to a molecular transistor using molecules filled in the nano size-gap as a channel, or to a detector using DNA and biological substance.

As described above, according to the present invention, a nano structure is formed to be floated in the air by using semiconductor layers having different etching rates from each other, and a nano size-gap is formed by controlling the height ranged from the semiconductor layer to the nano structure, the width of the nano structure, and the deposition angle of the metal. Unlike a conventional method in which a metal line is cut by mechanical stress or electromigration, or a primarily widened gap is narrowed by an electrochemical deposition method, according to the present invention, the position, the width, and the shape of the nano size-gap can be controlled with reproducibility and a plurality of nano size-gap electrode devices may be concurrently formed by one-time process, thereby easily realizing a molecular electronic circuit with high reliability.

While the invention has been shown and described with reference to certain exemplary embodiments thereof, it will be understood by those skilled in the art that various changes in form and details may be made therein without departing from the spirit and scope of the invention as defined by the appended claims.

For example, in the embodiments, the floating nano structure is provided at each nano size-gap electrode device, but a separately manufactured nano structure may be repeatedly used in such a method that it is disposed whenever the nano size-gap electrode device is manufactured. Further, the nano size-gap electrode device may be manufactured in a structure in which the nano structure of a wire type is not completely floated and partially supported.

What is claimed is:

1. A method of manufacturing a nano size-gap electrode device, comprising the steps of:
    disposing a floated nano structure on a semiconductor layer;
    forming a mask layer having at least one opening pattern across the nano structure; and
    depositing a metal on the semiconductor layer exposed through the opening pattern to form at least a pair of electrodes having a nano size-gap between the pair of electrodes such that the nano size-gap is formed under the nano structure.

2. The method according to claim 1, wherein the step of disposing the nano structure comprises the steps of:
    forming first and second semiconductor layers sequentially;
    patterning the second semiconductor layer to form the nano structure; and
    removing the first semiconductor layer under the nano structure by a predetermined thickness such that the nano structure is supported.

3. The method according to claim 2, wherein the first and second semiconductor layers have different etching rates from each other.

4. The method according to claim 2, wherein the first semiconductor layer is removed by a wet etching process.

5. The method according to claim 1, wherein the nano structure comprises a nano size-gap forming part with a wire type and supporting parts supporting both sides of the nano size-gap forming part.

6. The method according to claim 5, wherein the supporting part is formed wider than the nano size-gap forming part.

7. The method according to claim 1, wherein the mask layer is formed of a photosensitive material.

8. The method according to claim 1, wherein the metal is one selected from the group consisting of gold, silver, copper, and aluminum.

9. The method according to claim 1, wherein the metal is deposited at a predetermined tilt angle at both sides of the nano structure.

10. The method according to claim 1, wherein the nano size-gap has a width controlled by at least one of a width of the nano structure, a height of the nano structure, and a deposition angle of the metal.

11. The method according to claim 1, wherein the mask layer has a plurality of opening patterns that are formed off each other at a predetermined interval in the form of an array.

* * * * *